United States Patent
Frey

(10) Patent No.: US 7,136,298 B2
(45) Date of Patent: Nov. 14, 2006

(54) MAGNETIC RANDOM ACCESS MEMORY ARRAY WITH GLOBAL WRITE LINES

(75) Inventor: Christophe Frey, Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 143 days.

(21) Appl. No.: 10/880,981

(22) Filed: Jun. 30, 2004

(65) Prior Publication Data

US 2006/0002181 A1 Jan. 5, 2006

(51) Int. Cl.
*G11C 11/00* (2006.01)

(52) U.S. Cl. .................. 365/158; 365/171; 365/173

(58) Field of Classification Search .............. 365/158, 365/171, 173
See application file for complete search history.

(56) References Cited

U.S. PATENT DOCUMENTS

| | | | |
|---|---|---|---|
| 5,029,141 A | 7/1991 | Yoshimoto et al. | |
| 5,274,597 A | 12/1993 | Ohbayashi et al. | |
| 5,287,304 A | 2/1994 | Harward et al. | |
| 6,335,890 B1* | 1/2002 | Reohr et al. ............. | 365/225.5 |
| 6,532,163 B1* | 3/2003 | Okazawa ................... | 365/97 |
| 6,594,191 B1 | 7/2003 | Lammers et al. | |
| 6,639,834 B1 | 10/2003 | Sunaga et al. | |
| 6,717,844 B1 | 4/2004 | Ohtani | |
| 6,778,429 B1* | 8/2004 | Lu et al. ................... | 365/158 |
| 6,778,434 B1* | 8/2004 | Tsuji ........................ | 365/173 |
| 6,795,335 B1 | 9/2004 | Hidaka | |
| 6,829,162 B1 | 12/2004 | Hosotani | |
| 6,862,235 B1 | 3/2005 | Sakata et al. | |
| 6,891,742 B1* | 5/2005 | Takano et al. ............ | 365/145 |
| 6,894,918 B1 | 5/2005 | Sharma et al. | |
| 6,940,749 B1* | 9/2005 | Tsang ....................... | 365/171 |
| 2002/0027803 A1 | 3/2002 | Matsui | |
| 2002/0064067 A1 | 5/2002 | Inui | |
| 2002/0080644 A1 | 6/2002 | Ito | |
| 2003/0026125 A1 | 2/2003 | Hidaka | |
| 2003/0058686 A1 | 3/2003 | Ooishi et al. | |
| 2004/0052105 A1 | 3/2004 | Fulkerson et al. | |
| 2004/0125643 A1 | 7/2004 | Kang et al. | |
| 2004/0208052 A1 | 10/2004 | Hidaka | |
| 2005/0180203 A1* | 8/2005 | Lin et al. ................. | 365/171 |
| 2005/0281080 A1* | 12/2005 | Dray et al. ............... | 365/171 |

FOREIGN PATENT DOCUMENTS

EP 1 320 104 6/2003

OTHER PUBLICATIONS

Patent Abstracts of Japan, vol. 2000, No. 03, and JP 11 354728, Canon, Inc.
Nahas, "A 4Mb 0.μm 1T1MTJ Toggle MRAM Memory," 2004 IEEE International Solid-State Circuits Conference, ISSCC 2004, Session 2, Non-Volatile Memory/2.3, 0-7803-8267-6, 2004.

* cited by examiner

*Primary Examiner*—Anh Phung
(74) *Attorney, Agent, or Firm*—Lisa K. Jorgenson; Andre M. Szuwalski

(57) ABSTRACT

A random access memory array includes random access memory elements arranged in a rows and columns. Each row is divided into a plurality of row groups of elements and each column is divided into a plurality of column groups of elements. The elements in each row group share a common local write digit line and the elements in each column group share a common local write bit line. The array further includes at least one global write digit line coupled to the common local write digit lines of plural row groups, and at least one global write bit line coupled to the common local write bit lines of plural column groups.

25 Claims, 9 Drawing Sheets

MAGNETIC RANDOM ACCESS MEMORY ARRAY WITH GLOBAL WRITE LINES

BACKGROUND OF THE INVENTION

1. Technical Field of the Invention

The present invention relates to magnetic random access memories, and more particularly to a magnetic random access memory array architecture which supports reduced write current needs and low voltage operation.

2. Description of Related Art

A magnetic random access memory (MRAM) element typically has a structure that includes a first and second magnetic layers which are separated by a non-magnetic layer. A magnetic vector in one of the two magnetic layers is magnetically fixed or pinned, while the magnetic vector of the other of the two magnetic layers is not fixed and thus its magnetization direction is free to be controlled and switched. Information is written to and read from the element as a logic "1" or a logic "0" (i.e., one or the other of two possible logic states) by changing the direction of the non-fixed magnetization vector in the other of the two magnetic layers. The differences in magnetization vector direction cause resistance variations within the element which can be measured. For example, the shifting of the magnetization vector direction can represent two different resistances or potentials, which are then read by the memory circuit as either a logic "1" or a logic "0." The detection of these resistance or potential differences due to shifting magnetization vector direction allows information to be written to and read from the MRAM element.

Reference is now made to FIGS. 1A and 1B wherein there are shown schematic diagrams of conventional MRAM elements 10. Each element includes a bit line 12 and a word line 14. The memory storing structure of the element 10 is referred to as a "magnetic tunnel junction" 16 (MTJ) which is represented in the schematic by a variable resistance and is physically composed of the first and second magnetic layers and the separating non-magnetic layer discussed above.

With reference to FIG. 1A, one end of this resistance is connected to the bit line 12. The other end of the resistance is connected to a conduction terminal of an access transistor 18. The access transistor 18 in the illustrated element 10 is an n-channel FET with its source conduction terminal connected to ground and its drain conduction terminal connected to the other end of the resistance. The gate terminal of the access transistor 18 is connected to the word line 14.

With reference to FIG. 1B, one end of this resistance is connected to a reference voltage (for example, a ground reference). The other end of the resistance is connected to a conduction terminal of an access transistor 18. The access transistor 18 in the illustrated element 10 is an n-channel FET with its source conduction terminal connected to the bit line 12 and its drain conduction terminal connected to the other end of the resistance. The gate terminal of the access transistor 18 is connected to the word line 14.

In either of the embodiments of FIGS. 1A and 1B, a write digit line 20 (WDL) and a write bit line 22 (WBL) for the element 10 intersect at the magnetic tunnel junction 14. These lines 20 and 22 selectively carry currents and thus each selectively create a magnetic flux proximate to the magnetic tunnel junction 16. The magnetic fields induced by current flow in the lines 20 and 22 can be used to set the non-fixed direction of the magnetic vector within the magnetic tunnel junction 16. As discussed above, the setting of this direction affects the resistance of the magnetic tunnel junction 16. By selectively choosing the direction and magnitude of the current flow in the lines 20 and 22, one can program the magnetic tunnel junction 16, through its varying resistance, to store either one of two logic states: a logic "1" or a logic "0." It is recognized, however, that the current in both the lines 20 and 22 must be of a certain magnitude in order to effectively control the non-fixed direction of the magnetic vector within the magnetic tunnel junction 16. It is accordingly imperative that sufficient current be made available in both lines 20 and 22 in order to write information into the element 10.

Reference is now made to FIG. 2 wherein there is shown a block diagram of a conventional MRAM memory array 50. The array 50 includes a plurality of individual MRAM elements 10 (of any suitable type including either of those shown in FIGS. 1A and 1B) arranged in a N×M array format. Each row 52 of elements 10 in the array 50 includes a word line 14 and a write digit line 20. Each column 54 of elements 10 in the array 50 includes a bit line 12 and a write bit line 22. Selection of a write digit line 20 and write bit line 22, along with the application of appropriate currents thereto, results in the writing of an information bit to the element 10 in the array 50 where the selected write digit line and write bit line intersect. Selection of a bit line 12 and a word line 14 turns on the access transistor 18 located at the intersection of the selected bit line and word line, and causes a current to flow through the magnetic tunnel junction 16 resistance whose magnitude is dependent on the programmed non-fixed direction of the magnetic vector within the magnetic tunnel junction. A sense amplifier (not shown) that is connected to the selected bit line 12 measures the current flowing in the bit line, as affected by the current flowing through the magnetic tunnel junction 16 resistance, in order to "read" the logic state of the element 10.

The write digit lines 20 and write bit lines 22 which extend across the rows and columns, respectively, of the array 50 are metal lines having a certain resistance which depends generally speaking on their metallic composition and dimensions (primarily length). The MRAM array 50 is typically supplied with a certain voltage (for example, 5V, 3.3V or 1.2V) which is fixed. When additional elements 10 are added to rows and/or columns of the array 50, the resistance of the individual write digit lines 20 and write bit lines 22 also increases. Ohm's Law, however, teaches that with a fixed voltage and an increasing resistance there is a corresponding decrease in the amount of current capable of being carried by each metal line. This presents a problem because, as discussed above, a certain magnitude of current is required in the lines 20 and 22 in order write information into the element 10. Increases in line 20 and line 22 length to accommodate additional rows/columns may preclude the lines 20 and 22, at the fixed supply voltage or at reduced voltage levels, from being able to carry sufficient programming currents. Thus, for a given fixed voltage and given line 20/22 characteristics, there exists a maximum line length which is permitted within the array 50 in order to ensure successful writing to an element 10.

The issue of sufficient current for programming the element 10 becomes of even greater concern when writing an entire word (for example, eight bits) into a memory location within the array 50 comprised of a corresponding plurality of elements. This operation requires that sufficient current be available for supply not only to the write digit line associated with the selected memory location, but also for supply simultaneously to the eight write bit lines associated with the elements 10 for that memory location. The potential division of available current among these multiple lines 20/22 for the word writing operation further restricts and limits the permitted lengths of the individual lines.

Several solutions have been proposed in the art to the foregoing line length limitation problem. One solution is to change the structure of the element 10, and perhaps also the technology used to fabricate it (for example, materials, layer deposition depth, and the like), so as to reduce the minimum current magnitude characteristic of the element 10. Experiments with alternative structures and/or fabrication techniques have not been successful. Another solution is to live with the line 20/22 length limitations and create larger sized memories by repeating sub-blocks formed of arrays 50 whose size is limited in the manner described above. This solution is not preferred as the overall area required for the memory unreasonably increases due to the need to repetitively include peripheral circuits (control logic, decoders, read/write circuits and the like) for each sub-block.

A need accordingly exists for a solution which would allow for increasing the number of rows or columns in an MRAM array without necessitating increases in supply voltage. Alternatively, a need exists for a solution which would allow for supply voltages to be decreased while continuing to maintain a certain number of rows and columns of elements.

SUMMARY OF THE INVENTION

In accordance with one embodiment of the present invention, a random access memory array comprises a plurality of random access memory elements arranged in a plurality of rows and columns. Each row is divided into a plurality of row groups of elements and each column is divided into a plurality of column groups of elements. Each row group shares a common local write digit line and each column group shares a common local write bit line. The array further includes at least one global write digit line coupled to the common local write digit lines of plural row groups, and at least one global write bit line coupled to the common local write bit lines of plural column groups.

In accordance with another embodiment, a magnetic random access memory array includes a plurality of rows and columns of magnetic random access memory elements, where each row of elements is divided into a plurality of row groups and each column of elements is divided into a plurality of column groups. Each row group shares a common local write digit line and each column group shares a common local write bit line. A global write digit line is coupled to each of the common local write digit lines across plural row groups; and a global write bit line is coupled to each of the common local write bit lines across plural column groups.

In accordance with yet another embodiment of the invention, a magnetic random access memory array comprises a plurality of magnetic random access memory elements in a line. That line is divided into a plurality of groups of elements. Each group of elements shares a common local write line and a global write line is coupled to each of the common local write lines.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 1A and 11B are schematic diagrams of prior art magnetic random access memory (MRAM) elements;

DETAILED DESCRIPTION OF THE DRAWINGS

Figure 3A:
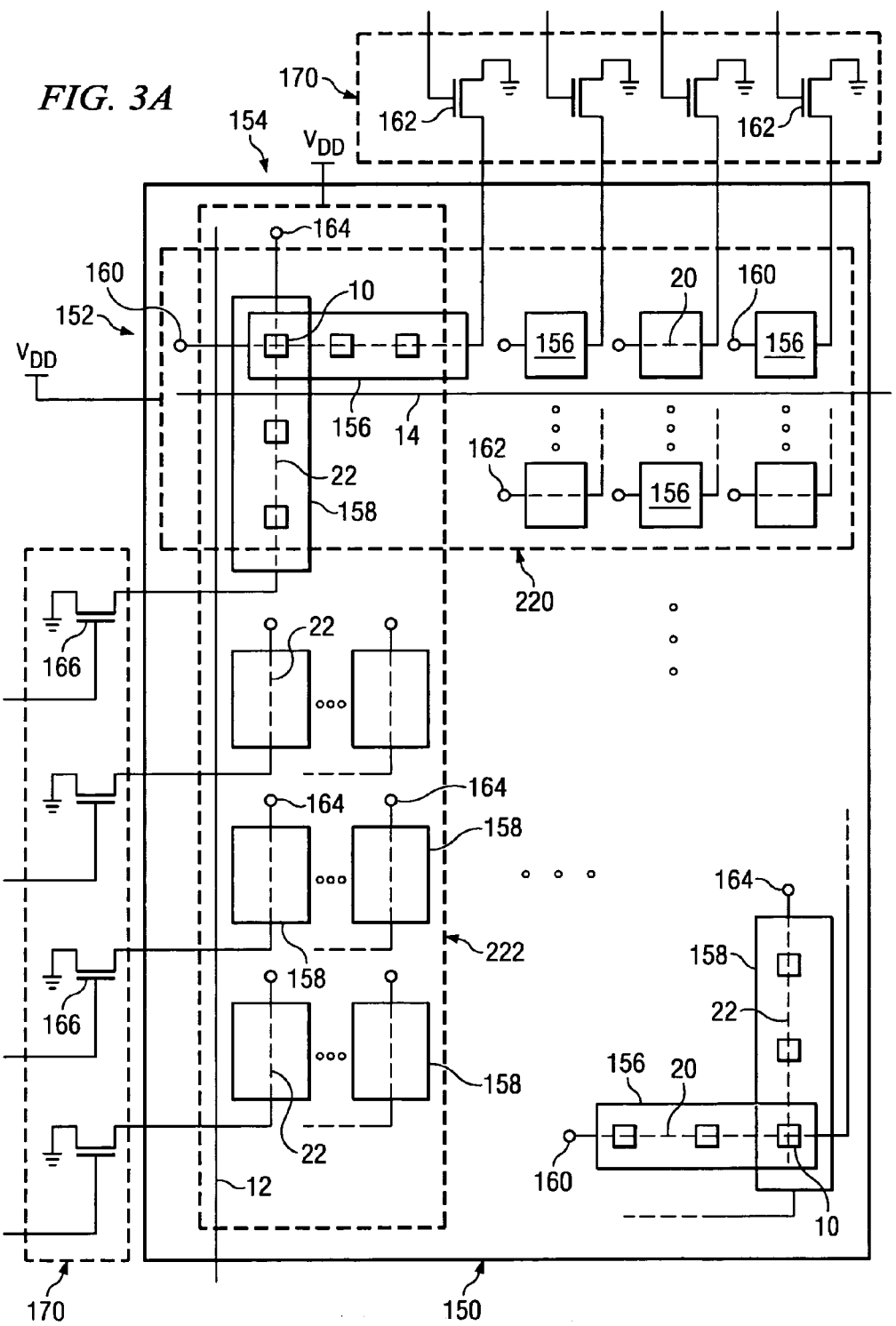
FIGS. 3A and 3B are block diagrams of an MRAM memory array in accordance with alternative implementations of a first embodiment of the present invention.

Reference is now made to FIG. 3A wherein there is shown a block diagram of an MRAM memory array 150 in accordance with a first alternative of a first embodiment of the present invention. The array 150 includes a plurality of individual MRAM elements 10 (of any suitable type including either of those shown in FIGS. 1A and 1B) arranged in a N×M array format. The array 150 includes a plurality of rows 152 and columns 154 populated with an individual element 10 located at each row/column intersection point.

The elements 10 in each row 152 of the array 150 are divided into a plurality of groups 156. For example, FIG. 3A illustrates four groups 156 of elements 10 for each row 152. Preferably, the elements 10 in each row 152 are equally divided among the groups 156. Similarly, the elements 10 in each column 154 of the array 150 are divided into a plurality of groups 158. For example, FIG. 3A illustrates four groups 158 of elements 10 for each column 154. Preferably, the elements 10 in each column 154 are equally divided among the groups 158.

Each group 156 of elements in a row 152 has its own local write digit line 20. Each local write digit line is connected between a node 160 and a local row selection transistor 162 that is included in a write control circuit 170 for the array 150. More specifically, in the illustrated example, the local row selection transistors 162 are n-channel FET devices having a drain terminal connected to a local write digit line 20 and a source terminal connected to a reference voltage (for example, ground). The gate terminal of each local row selection transistor 162 receives a selection signal which turns the transistor on and allows a write current to flow in the selected local write digit line 20. Similarly, each group 158 of elements in a column 154 has its own local write bit line 22. Each local write bit line is connected between a node 164 and a local column selection transistor 166 that is included in a write control circuit 170 for the array 150. More specifically, in the illustrated example, the local column selection transistors 166 are n-channel FET devices having a drain terminal connected to a local write bit line 22 and a source terminal connected to a reference voltage (for example, ground). The gate terminal of each local column selection transistor 166 receives a selection signal which turns the transistor on and allows a write current to flow in the selected local write bit line 22.

Each row 152 of elements 10 in the array includes a word line 14 and a global write digit line 220. More specifically, the global write digit line 220 (outlined with a dot-dash line) is a metal layer that is connected to a reference voltage (for example, a positive voltage Vdd) and which is connected to each of the local write digit lines 20 in a row and may, in a preferred implementation, be shared among and between a plurality of rows 152 of the array 150. The global write digit line 220 is then connected to each of the plural local write digit lines 20 through the nodes 160. In an embodiment of the invention, the global write digit line 220 is a metal layer positioned above the elements 10 of the array 150 in the semiconductor structure and extending along a row 152 (and, if desired, across a plurality of rows 152) with via connections to the nodes 160. If the array 150 is large enough, plural global write digit lines 220 may be used to provide coverage across all of the rows 152 (with plural groups of rows provided and each group utilizing its own global line).

Similarly, each column 154 of elements 10 in the array 150 includes a bit line 12 and a global write bit line 222. The global write bit line 222 (outlined with a dot-dot-dash line) is a metal layer that is connected to a reference voltage (for example, a positive voltage Vdd) and which is connected to each of the local write bit lines 22 in a column and may, in a preferred implementation, be shared among and between a plurality of columns 154 of the array 150. The global write bit line 222 is then connected to each of the plural local write bit lines 22 through the nodes 164. In an embodiment of the invention, the global write bit line 222 is a metal layer positioned above the elements 10 of the array 150 in the semiconductor structure and extending along a column 154 (and, if desired, across a plurality of columns 154) with via connections to the nodes 164. If the array 150 is large enough, plural global write bit lines 222 may be used to provide coverage across all of the columns 154 (with plural groups of columns provided and each group utilizing its own global line).

Figure 5A:
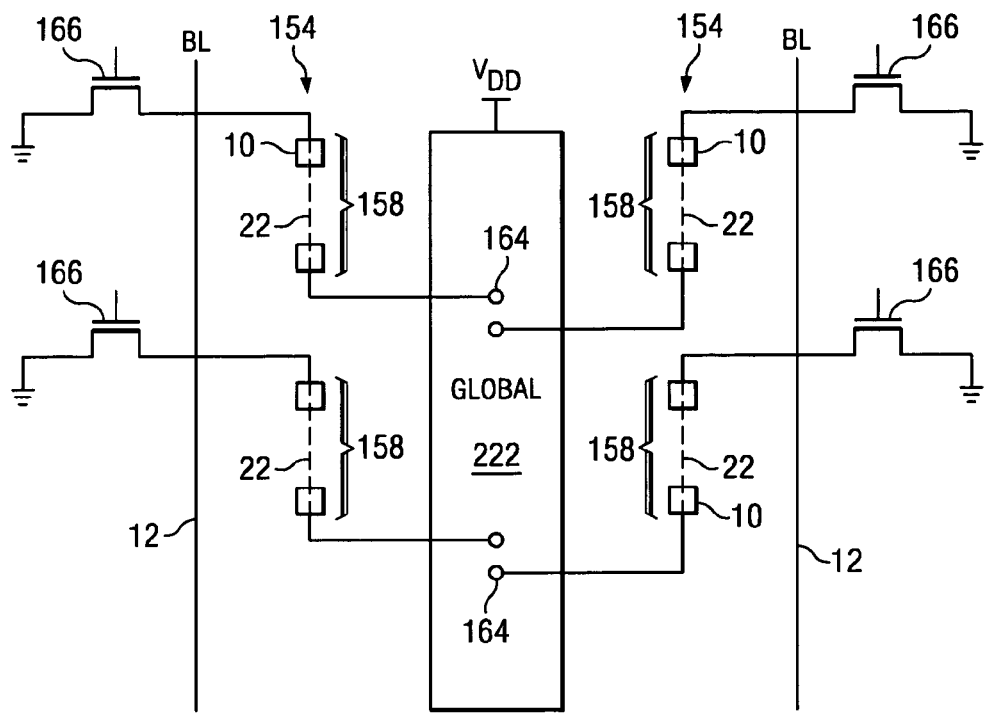
FIGS. 5A and 5B are simplified schematic diagrams of the first embodiment implementations shown in FIGS. 3A and 3B, respectively.

A simplified schematic diagram illustrating this embodiment is provided in FIG. 5A. More specifically, the illustration made only of the implementation as it applies to the columns 154 of the array 150. It will, of course, be understood that an analogous schematic representation applies with respect to the rows 152.

Figure 3B:
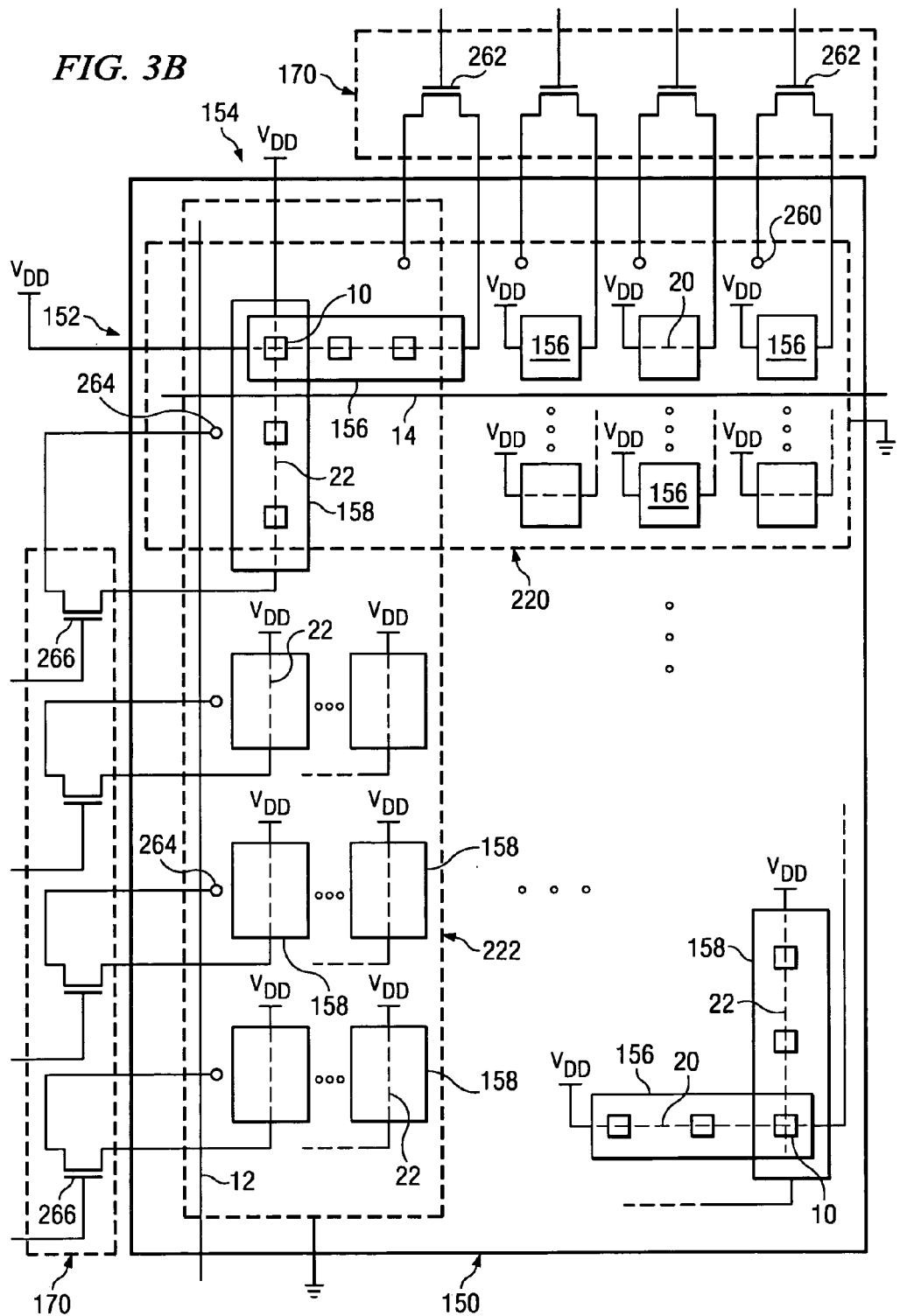

Reference is now made to FIG. 3B wherein there is shown a block diagram of an MRAM memory array 150 in accordance with a second alternative of a first embodiment of the present invention. Like reference numbers in FIG. 3A refer to like or similar parts in FIG. 3B and thus no further explanation is provided.

Each group 156 of elements in a row 152 has its own local write digit line 20. Each local write digit line is connected between a reference voltage (for example, a positive voltage Vdd) and a local row selection transistor 262 that is included in a write control circuit 170 for the array 150. More specifically, in the illustrated example, the local row selection transistors 262 are n-channel FET devices having a drain terminal connected to a local write digit line 20 and a source terminal connected to a node 260. The gate terminal of each local row selection transistor 262 receives a selection signal which turns the transistor on and allows a write current to flow in the selected local write digit line 20. Similarly, each group 158 of elements in a column 154 has its own local write bit line 22. Each local write bit line is connected between a reference voltage (for example, a positive voltage Vdd) and a local column selection transistor 266 that is included in a write control circuit 170 for the array 150. More specifically, in the illustrated example, the local column selection transistors 266 are n-channel FET devices having a drain terminal connected to a local write bit line 22 and a source terminal connected to a node 264. The gate terminal of each local column selection transistor 266 receives a selection signal which turns the transistor on and allows a write current to flow in the selected local write bit line 22.

Each row 152 of elements 10 in the array includes a word line 14 and a global write digit line 220. More specifically, the global write digit line 220 is a metal layer that is connected to a reference voltage (for example, ground) and which is connected to each of the local write digit lines 20 in a row and may, in a preferred implementation, be shared among and between a plurality of rows 152 of the array 150. The global write digit line 220 is then connected to each of the plural local write digit lines 20 through the nodes 260. In an embodiment of the invention, the global write digit line 220 is a metal layer positioned above the elements 10 of the array 150 in the semiconductor structure and extending along a row 152 (and, if desired, across a plurality of rows 152) with via connections to the nodes 260. If the array 150 is large enough, plural global write digit lines 220 may be used to provide coverage across all of the rows 152 (with plural groups of rows provided and each group utilizing its own global line).

Similarly, each column 154 of elements 10 in the array 150 includes a bit line 12 and a global write bit line 222. The global write bit line 222 is a metal layer that is connected to a reference voltage (for example, ground) and which is connected to each of the local write bit lines 22 in a column and may, in a preferred implementation, be shared among and between a plurality of columns 154 of the array 150. The global write bit line 222 is then connected to each of the plural local write bit lines 22 through the nodes 264. In an embodiment of the invention, the global write bit line 222 is a metal layer positioned above the elements 10 of the array 150 in the semiconductor structure and extending along a column 154 (and, if desired, across a plurality of columns 154) with via connections to the nodes 264. If the array 150 is large enough, plural global write bit lines 222 may be used to provide coverage across all of the columns 154 (with plural groups of columns provided and each group utilizing its own global line).

Figure 5B:
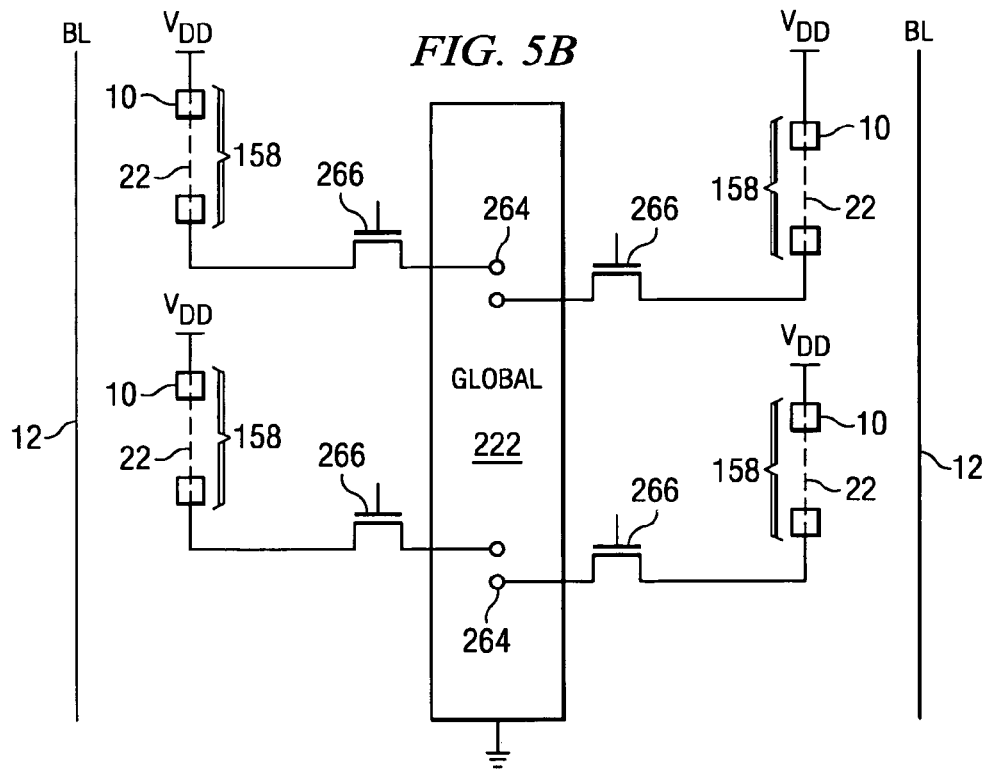

A simplified schematic diagram illustrating this embodiment is provided in FIG. 5B. More specifically, the illustration made only of the implementation as it applies to the columns 154 of the array 150. It will, of course, be understood that an analogous schematic representation applies with respect to the rows 152.

Figure 4A:
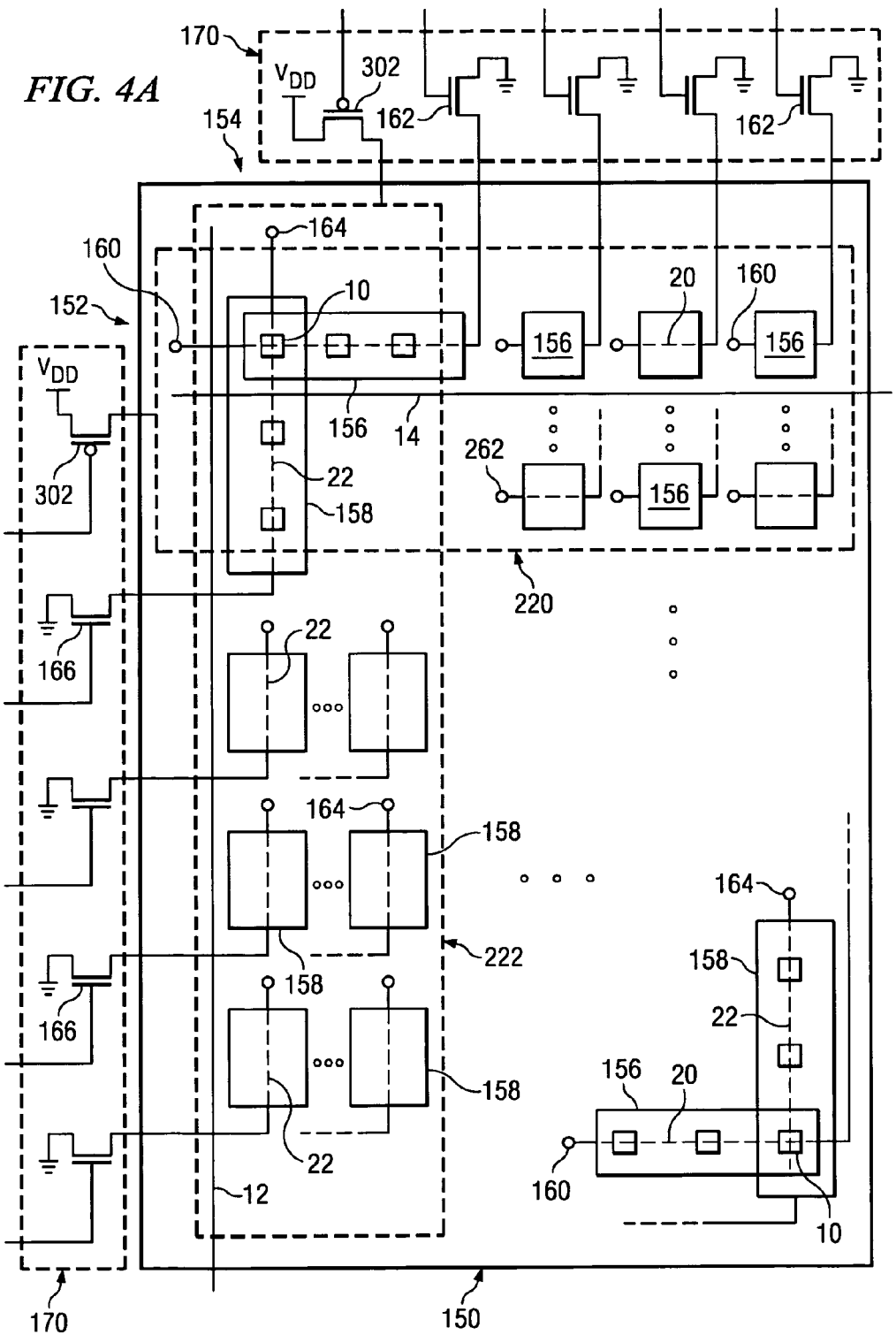
FIGS. 4A, 4B and 4C are block diagrams of an MRAM memory array in accordance with alternative implementations of a second embodiment of the present invention.

Reference is now made to FIG. 4A wherein there is shown a block diagram of an MRAM memory array in accordance with a first alternative of a second embodiment of the present invention. Like reference numbers in FIG. 3A refer to like or similar parts in FIG. 4A and thus no further explanation is provided.

Instead of having each included global write digit line 220 be directly connected to the reference voltage (positive Vdd) as shown in FIG. 3A, the implementation in FIG. 4A instead includes a global write digit line selection transistor 300 coupled between the reference voltage (positive Vdd) and each one of the included global write digit lines 220. More specifically, in the illustrated example, the global write digit line selection transistors 300 are p-channel FET devices having a drain terminal connected to a global write digit line 220 and a source terminal connected to the reference voltage. The gate terminal of each global write digit line selection transistor 300 receives a selection signal which turns the transistor on and allows a write current to be sourced to the selected global write digit line 220.

Similarly, instead of having each included global write bit line 222 be directly connected to the reference voltage (positive Vdd) as shown in FIG. 3A, the implementation in FIG. 4A instead includes a global write bit line selection transistor 302 coupled between the reference voltage (positive Vdd) and each one of the included global write bit lines 222. More specifically, in the illustrated example, the global write bit line selection transistors 302 are p-channel FET devices having a drain terminal connected to a global write bit line 222 and a source terminal connected to the reference voltage. The gate terminal of each global write bit line selection transistor 302 receives a selection signal which turns the transistor on and allows a write current to be sourced to the selected global write bit line 222.

Figure 6A:
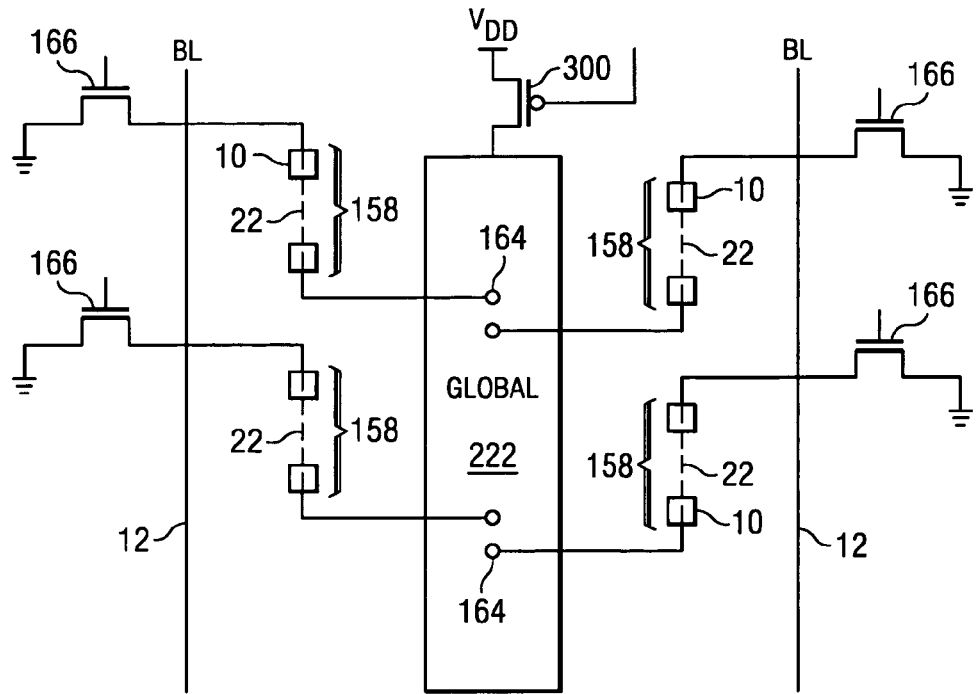
FIGS. 6A, 6B and 6C are simplified schematic diagrams of the second embodiment implementations shown in FIGS. 4A, 4B and 4C, respectively.

A simplified schematic diagram illustrating this embodiment is provided in FIG. 6A. More specifically, the illustration made only of the implementation as it applies to the columns 154 of the array 150. It will, of course, be understood that an analogous schematic representation applies with respect to the rows 152.

Figure 4B:
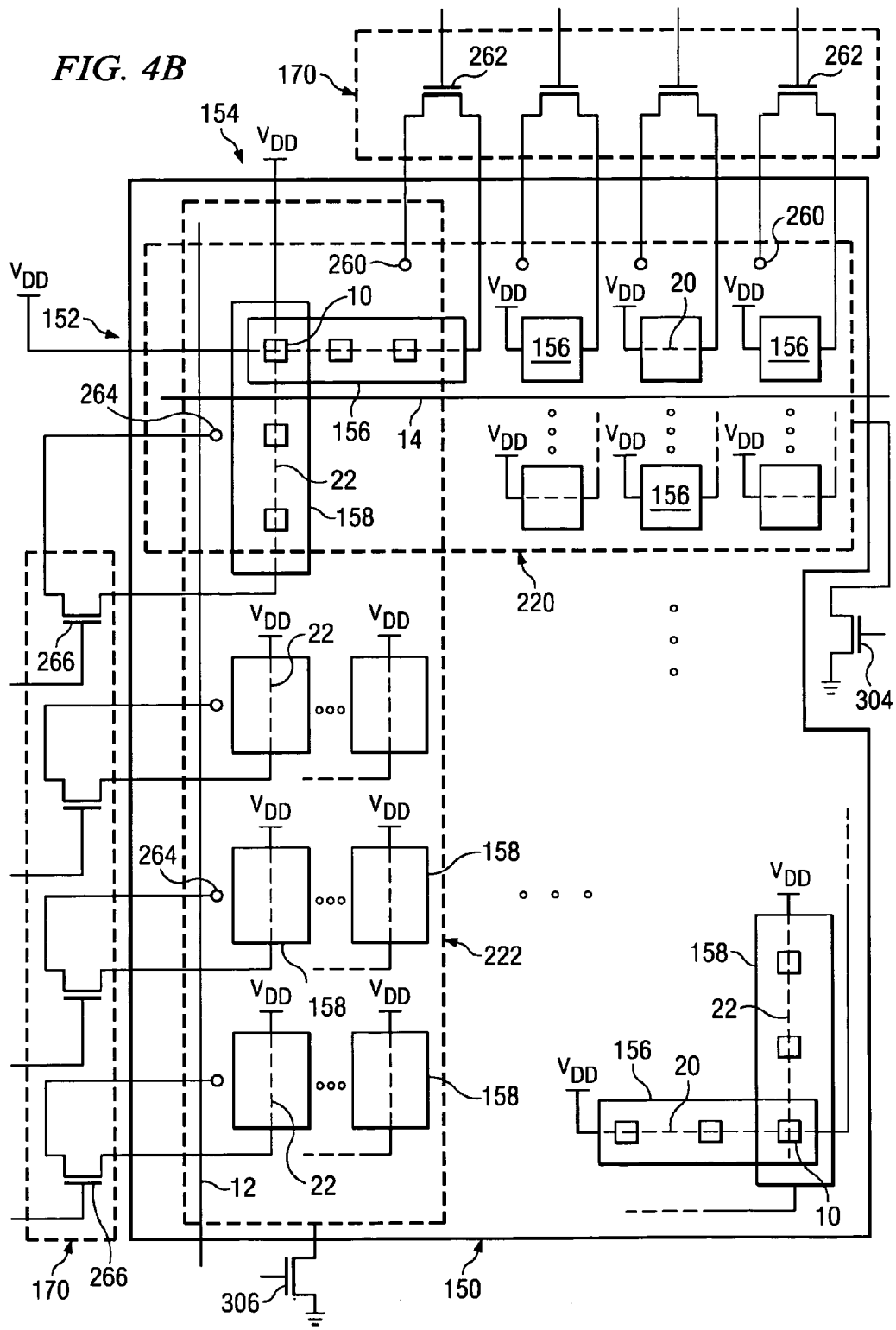

Reference is now made to FIG. 4B wherein there is shown a block diagram of an MRAM memory array in accordance with a second alternative of a second embodiment of the present invention. Like reference numbers in FIG. 3B refer to like or similar parts in FIG. 4B and thus no further explanation is provided.

Instead of having each included global write digit line 220 be directly connected to the reference voltage (ground) as shown in FIG. 3B, the implementation in FIG. 4B instead includes a global write digit line selection transistor 304 coupled between the reference voltage (ground) and each one of the included global write digit lines 220. More specifically, in the illustrated example, the global write digit line selection transistors 304 are n-channel FET devices having a drain terminal connected to a global write digit line 220 and a source terminal connected to the reference voltage. The gate terminal of each global write digit line selection transistor 304 receives a selection signal which turns the transistor on and allows a write current to be sunk through the selected global write digit line 220.

Similarly, instead of having each included global write bit line 222 be directly connected to the reference voltage (ground) as shown in FIG. 3B, the implementation in FIG. 4B instead includes a global write bit line selection transistor 306 coupled between the reference voltage (ground) and each one of the included global write bit lines 222. More specifically, in the illustrated example, the global write bit line selection transistors 306 are n-channel FET devices having a drain terminal connected to a global write bit line 222 and a source terminal connected to the reference voltage. The gate terminal of each global write bit line selection transistor 306 receives a selection signal which turns the transistor on and allows a write current to be sunk through the selected global write bit line 222.

Figure 6B:
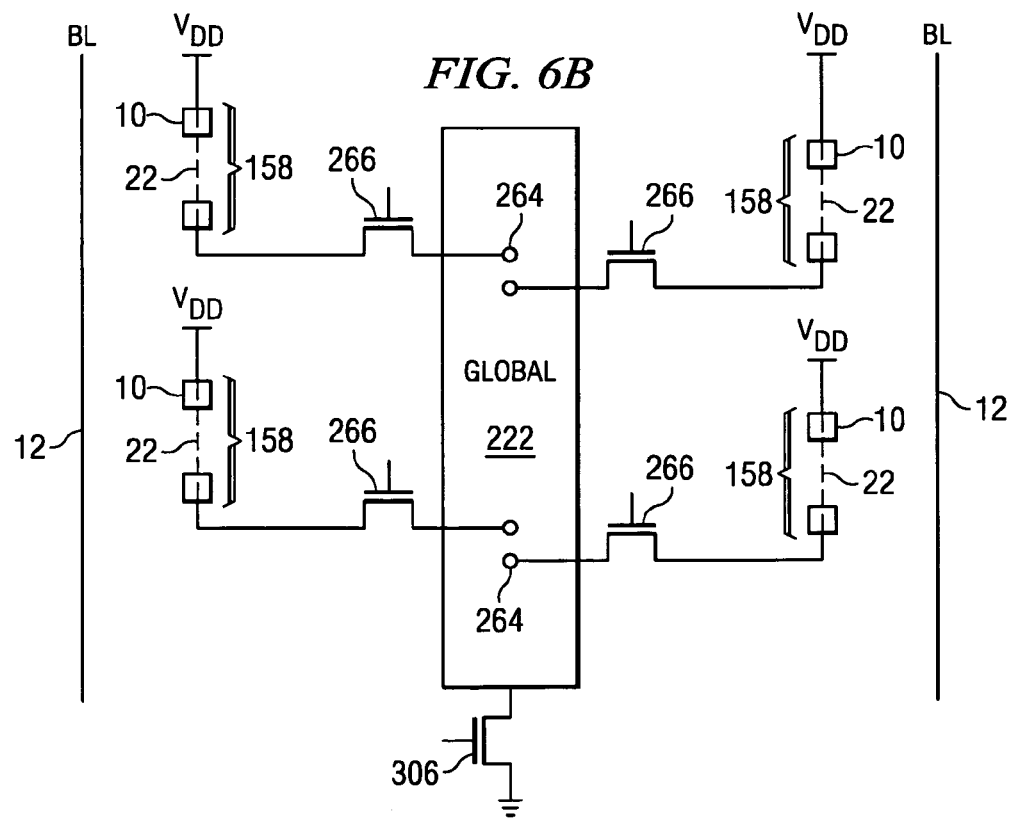

A simplified schematic diagram illustrating this embodiment is provided in FIG. 6B. More specifically, the illustration made only of the implementation as it applies to the columns 154 of the array 150. It will, of course, be understood that an analogous schematic representation applies with respect to the rows 152.

Figure 4C:
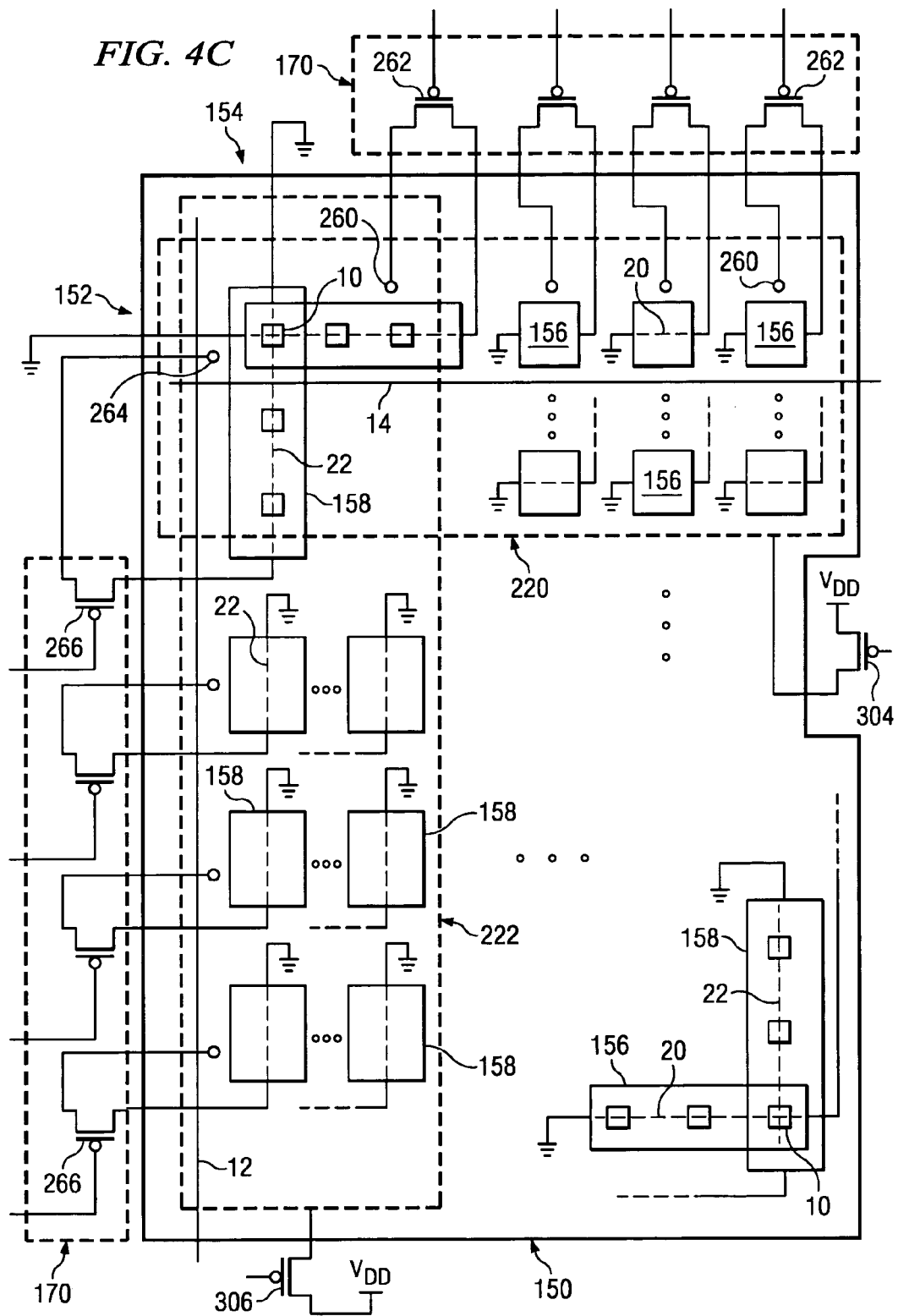

Reference is now made to FIG. 4C wherein there is shown a block diagram of an MRAM memory array in accordance with a third alternative of a second embodiment of the present invention. Like reference numbers in prior Figures refer to like or similar parts in FIG. 4C and thus no further explanation is provided.

Instead of having the included transistors comprise n-channel devices (as in FIG. 4B), this third alternative uses p-channel devices. A global write digit line selection transistor 304 is coupled between a reference voltage (Vdd) and each one of the included global write digit lines 220. More specifically, in the illustrated example, the global write digit line selection transistors 304 are p-channel FET devices having a drain terminal connected to a global write digit line 220 and a source terminal connected to the reference voltage. The gate terminal of each global write digit line selection transistor 304 receives a selection signal which turns the transistor on and allows a write current to be supplied through the selected global write digit line 220.

Similarly, a global write bit line selection transistor 306 is coupled between the reference voltage (Vdd) and each one of the included global write bit lines 222. More specifically, in the illustrated example, the global write bit line selection transistors 306 are p-channel FET devices having a drain terminal connected to a global write bit line 222 and a source terminal connected to the reference voltage. The gate terminal of each global write bit line selection transistor 306 receives a selection signal which turns the transistor on and allows a write current to be sunk through the selected global write bit line 222.

Each local write digit line is connected between a ground reference and a local row selection transistor 262 that is included in a write control circuit 170 for the array 150. More specifically, in the illustrated example, the local row selection transistors 262 are p-channel FET devices having a drain terminal connected to a local write digit line 20 and a source terminal connected to a node 260 (which is connected to the global line 220). The gate terminal of each local row selection transistor 262 receives a selection signal which turns the transistor on and allows a write current to flow in the selected local write digit line 20. Similarly, each local write bit line is connected between a ground reference and a local column selection transistor 266 that is included in a write control circuit 170 for the array 150. More specifically, in the illustrated example, the local column selection transistors 266 are p-channel FET devices having a drain terminal connected to a local write bit line 22 and a source terminal connected to a node 264 (which is connected to the global line 222). The gate terminal of each local column selection transistor 266 receives a selection signal which turns the transistor on and allows a write current to flow in the selected local write bit line 22.

Figure 6C:
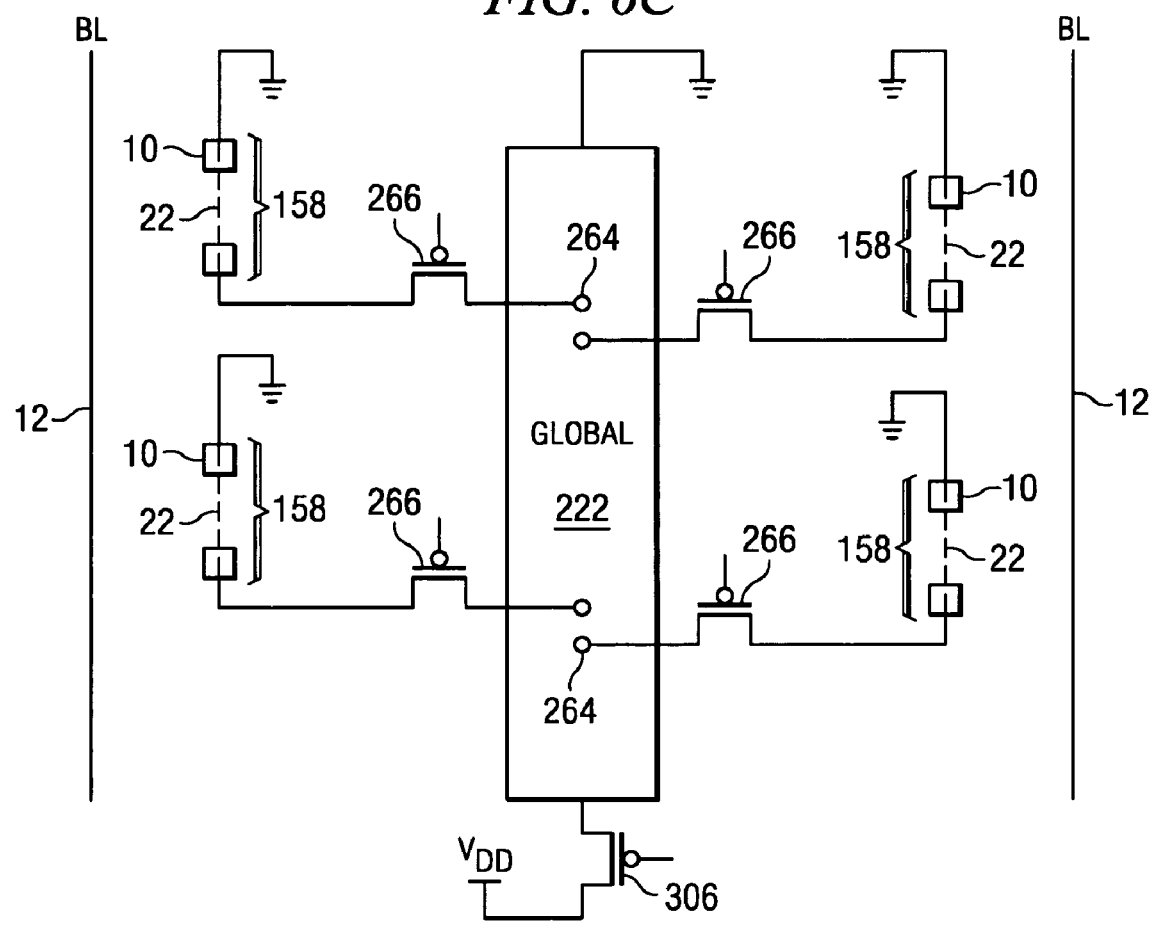

A simplified schematic diagram illustrating this embodiment is provided in FIG. 6C. More specifically, the illustration made only of the implementation as it applies to the columns 154 of the array 150. It will, of course, be understood that an analogous schematic representation applies with respect to the rows 152.

The terms "interconnected", "connected" or "coupled" as used herein do not necessarily require a direct connection among and between the recited components. Rather, it will be appreciated by those skilled in the art that the Figures are illustrative and indirect connections or couplings through other components or devices is possible without detracting from the operation of the invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A magnetic random access memory array, comprising:
   a plurality of rows and columns of magnetic random access memory elements, each row being divided into a plurality of row groups of elements and each column being divided into a plurality of column groups of elements, the elements of each row group sharing a common local magnetic write digit line and the elements of each column group sharing a common local magnetic write bit line;
   at least one global magnetic write digit line coupled to the common local magnetic write digit lines of plural row groups but not electrically connected to a read word line for each row of elements; and
   at least one global magnetic write bit line coupled to the common local magnetic write bit lines of plural column groups but not electrically connected to a read bit line for each column elements.

2. A magnetic random access memory array, comprising:
   a plurality of rows and columns of magnetic random access memory elements, each row being divided into a plurality of row groups of elements and each column being divided into a plurality of column groups of elements, the elements of each row group sharing a common local write digit line and the elements of each column group sharing a common local write bit line;
   at least one global write digit line coupled to the common local write digit lines of plural row groups;
   at least one global write bit line coupled to the common local write bit lines of plural column groups;
   a first access transistor coupling the at least one global write digit line to a reference voltage; and
   a second access transistor coupling the at least one global write bit line to the reference voltage.

3. The array of claim 2, wherein the reference voltage is a positive voltage.

4. The array of claim 2, wherein the reference voltage is a ground voltage.

5. The array of claim 1, wherein the at least one global magnetic write digit line is coupled to the common local magnetic write digit lines of plural row groups in a single row.

6. The array of claim 1, wherein the at least one global magnetic write digit line is coupled to the common local magnetic write digit lines of plural row groups across a plurality of rows.

7. The array of claim 1, wherein the at least one global magnetic write bit line is coupled to the common local magnetic write bit lines of plural column groups in a single column.

8. The array of claim 1, wherein the at least one global magnetic write bit line is coupled to the common local magnetic write bit lines of plural column groups across a plurality of columns.

9. The array of claim 1, wherein the at least one global magnetic write digit line comprises a plurality of global magnetic write digit lines.

10. The array of claim 9, wherein each of the global magnetic write digit lines is coupled to the common local magnetic write digit lines of plural row groups in a single row.

11. The array of claim 9, wherein each of the global magnetic write digit lines is coupled to the common local magnetic write digit lines of plural row groups across a plurality of rows.

12. The array of claim 1, wherein the at least one global magnetic write bit line comprises a plurality of global magnetic write bit lines.

13. The array of claim 12, wherein each of the global magnetic write bit lines is coupled to the common local magnetic write bit lines of plural column groups in a single column.

14. The array of claim 13, wherein each of the global magnetic write bit lines is coupled to the common local magnetic write bit lines of plural column groups across a plurality of columns.

15. A magnetic random access memory array, comprising:
    a plurality of rows and columns of magnetic random access memory elements, each row being divided into a plurality of row groups of elements and each column being divided into a plurality of column groups of elements, the elements in each row group sharing a common local magnetic write digit line and the elements in each column group sharing a common local magnetic write bit line;
    a global magnetic write digit line coupled to each of the common local magnetic write digit lines across plural row groups but not electrically connected to a read word line for each row of elements; and
    a global magnetic write bit line coupled to each of the common local magnetic write bit lines across plural column groups but not electrically connected to a read bit line for each column elements.

16. A magnetic random access memory array, comprising:
    a plurality of rows and columns of magnetic random access memory elements, each row being divided into a plurality of row groups of elements and each column being divided into a plurality of column groups of elements, the elements in each row group sharing a common local write digit line and the elements in each column group sharing a common local write bit line;
    a global write digit line coupled to each of the common local write digit lines across plural row groups;
    a global write bit line coupled to each of the common local write bit lines across plural column groups;
    a first access transistor coupling the at least one global write digit line to a reference voltage; and
    a second access transistor coupling the at least one global write bit line to the reference voltage.

17. The array of claim 16, wherein the reference voltage is a positive voltage.

18. The array of claim 16, wherein the reference voltage is a ground voltage.

19. A magnetic random access memory array, comprising:
    a plurality of magnetic random access memory elements in a column line, wherein that column line is divided into a plurality of groups of elements, and wherein the elements in each group share a common local magnetic write bit line;
    a global magnetic write bit line coupled to each of the common local magnetic write bit lines; and
    a read bit line for each column that is not electrically coupled to any of the common local magnetic write bit lines or the global magnetic write bit line.

20. A magnetic random access memory array, comprising:
    a plurality of magnetic random access memory elements in a line, wherein that line is divided into a plurality of groups of elements, and wherein the elements in each group share a common local magnetic write line;
    a global magnetic write line coupled to each of the common local magnetic write lines; and an access transistor source/drain coupling the global magnetic write line to a reference voltage.

21. The array of claim 20, wherein the reference voltage is a positive voltage.

22. The array of claim 20, wherein the reference voltage is a ground voltage.

23. The array of claim 19, wherein each common local magnetic write bit line is connected to an access transistor.

24. The array of claim 23, wherein the access transistor couples the common local magnetic write bit line to a reference voltage.

25. The array of claim 23, wherein the access transistor couples the common local magnetic write bit line to the global magnetic write bit line.

* * * * *

UNITED STATES PATENT AND TRADEMARK OFFICE
CERTIFICATE OF CORRECTION

PATENT NO.         : 7,136,298 B2  
APPLICATION NO. : 10/880981  
DATED                 : November 14, 2006  
INVENTOR(S)       : Christophe Frey Page 1 of 1

Figure 1A:
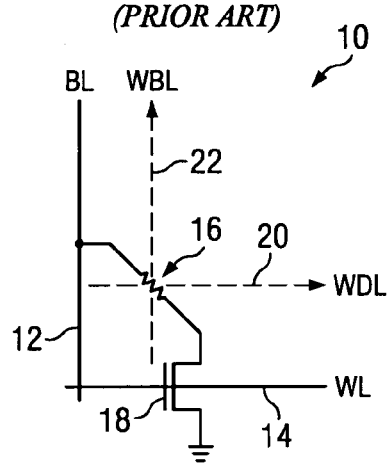
Figure 1B:
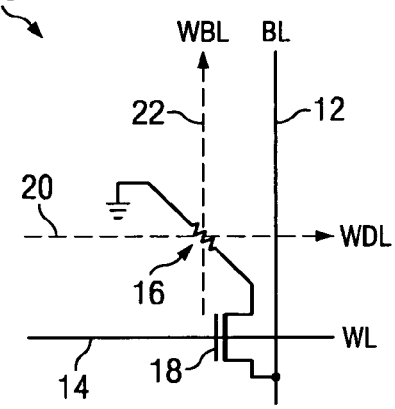
Figure 2:
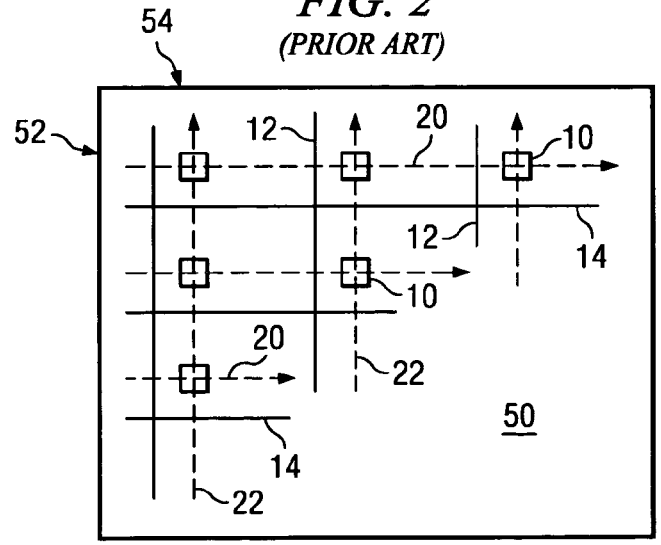
FIG. 2 is a block diagram of a conventional MRAM memory array.

It is certified that error appears in the above-identified patent and that said Letters Patent is hereby corrected as shown below:

| | |
|---|---|
| On the title page item (56), under U.S. PATENT DOCUMENTS | Add<br>--2004/0047204 A1   6/2004   Hung et al.<br>   6,331,943         12/2001   Naji et al.<br>   5,748,545          5/1998    Lee et al. |
| On the title page item (56), under OTHER PUBLICATIONS Section | Add<br>--European Search Report, EP 05 25 4084, dated July 28, 2006-- |
| Column 3, line 66 | Replace "FIGS. 1A and 11B"<br>With --FIGS. 1A and 1B-- |

Signed and Sealed this

Twenty-fourth Day of April, 2007

JON W. DUDAS  
*Director of the United States Patent and Trademark Office*